United States Patent
Bourilkov et al.

(10) Patent No.: US 12,166,369 B2
(45) Date of Patent: *Dec. 10, 2024

(54) MONITORING CAPACITY OF A POWER BANK BATTERY AND DEVICES CHARGED THEREWITH

(71) Applicant: DURACELL U.S. OPERATIONS, INC., Wilmington, DE (US)

(72) Inventors: Jordan Bourilkov, Bethany, CT (US); John Rotondo, Trumbull, CT (US); Francisco Jose Restrepo, Fairfield, CT (US); Sergio Coronado Hortal, Bethel, CT (US)

(73) Assignee: DURACELL U.S. OPERATIONS, INC., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/389,194

(22) Filed: Nov. 13, 2023

(65) Prior Publication Data

US 2024/0162733 A1 May 16, 2024

Related U.S. Application Data

(63) Continuation of application No. 16/827,459, filed on Mar. 23, 2020, now Pat. No. 11,817,733.

(51) Int. Cl.
*H02J 7/00* (2006.01)
*G01R 31/392* (2019.01)
(Continued)

(52) U.S. Cl.
CPC ............ *H02J 7/005* (2020.01); *G01R 31/392* (2019.01); *H01M 10/425* (2013.01);
(Continued)

(58) Field of Classification Search
CPC ........ H02J 7/005; H02J 7/00034; H02J 7/342; H02J 7/02; G01R 31/392; H01M 10/425;
(Continued)

(56) References Cited

U.S. PATENT DOCUMENTS 6,946,817 B2   9/2005   Fischer et al.
7,471,059 B2   12/2008  Bayne et al.
(Continued)

FOREIGN PATENT DOCUMENTS

CA       2737820 A1    10/2011
CN     104065146 A      9/2014
(Continued)

OTHER PUBLICATIONS

Internal Photos, OET Exhibits List, Federal Communications Commission, Office of Engineering and Technology, retrieved from the Internet at: <https://apps.fcc.gov/eas/GetApplicationAttachment.html?id=3632945>> made available only on Nov. 9, 2017.
(Continued)

*Primary Examiner* — Nathaniel R Pelton
(74) *Attorney, Agent, or Firm* — MARSHALL, GERSTEIN & BORUN LLP

(57) ABSTRACT

A portable power bank including a rechargeable battery may detect loss of capacity in the power bank battery. The power bank determines a nominal capacity of the power bank, and an actual capacity of the power bank, the actual capacity being less than the nominal capacity. The power bank compares the actual capacity to the nominal capacity to determine a health value of the power bank battery. When the power bank battery health value is at or below a threshold value, the power bank transmits an indication of the health value to a mobile computing device.

18 Claims, 7 Drawing Sheets

(51) Int. Cl.
  *H01M 10/42* (2006.01)
  *H01M 10/44* (2006.01)
  *H01M 10/48* (2006.01)
  *H02J 7/02* (2016.01)
  *H02J 7/34* (2006.01)

(52) U.S. Cl.
  CPC ........... *H01M 10/44* (2013.01); *H01M 10/48* (2013.01); *H02J 7/00034* (2020.01); *H02J 7/02* (2013.01); *H02J 7/342* (2020.01); *H01M 2010/4271* (2013.01); *H01M 2010/4278* (2013.01); *H01M 2220/30* (2013.01)

(58) Field of Classification Search
  CPC ............... H01M 10/44; H01M 10/48; H01M 2010/4271; H01M 2010/4278; H01M 2220/30
  USPC ......................................................... 320/103
  See application file for complete search history.

(56) References Cited

U.S. PATENT DOCUMENTS

| | | | |
|---|---|---|---|
| 7,701,173 | B2 | 4/2010 | Veselic |
| 7,791,319 | B2 | 9/2010 | Veselic et al. |
| 9,444,274 | B2 | 9/2016 | Tu |
| 9,562,745 | B2 * | 2/2017 | Partridge ............ H02J 7/00036 |
| 9,647,474 | B2 | 5/2017 | Fathollahi et al. |
| 9,726,763 | B2 | 8/2017 | Dempsey et al. |
| 9,983,312 | B2 | 5/2018 | Dempsey et al. |
| 10,416,309 | B2 | 9/2019 | Dempsey et al. |
| 2013/0049704 | A1 | 2/2013 | Andou et al. |
| 2015/0194839 | A1 | 7/2015 | Wojcik et al. |
| 2015/0349385 | A1 * | 12/2015 | Hu ........................ G01R 31/367 702/63 |
| 2016/0226278 | A1 * | 8/2016 | Wenger ..................... B25F 5/00 |
| 2017/0047760 | A1 | 2/2017 | Rippel et al. |
| 2020/0136414 | A1 * | 4/2020 | Patsos ..................... H02J 7/342 |

FOREIGN PATENT DOCUMENTS

| | | |
|---|---|---|
| CN | 104810900 A | 7/2015 |
| GB | 2401258 B | 6/2005 |

OTHER PUBLICATIONS

Orbit 5000mAh Portable Charger Powerbank with Bluetooth Tracker—Black, HButler, retrieved from the Internet at: <<https://www.amazon.com/dp/B0719MFHRD/ref=as_li_ss_tl?tag=mode065-20&_encoding=UTF8&psc=1&linkId=398a91042563750e414c24c69ab645ff&language=en_US>> made available May 17, 2017.

CoalBit Doubles As Power Bank and Bluetooth Tracker, retrieved from the Internet at: https://www.digitaltrends.com/mobile/coalbit-power-bank-kickstarter/ made available only on Mar. 23, 2016.

Goplug smart power bank (110v) gppb0110v b&h photo video, retrieved from the internet at: https://www.bhphotovideo.com/c/product/1348369-reg/goplug_gppb0110v_110v_smart_power_bank.html/overview believed to be publically available by 2000-2020.

* cited by examiner

MONITORING CAPACITY OF A POWER BANK BATTERY AND DEVICES CHARGED THEREWITH

CROSS-REFERENCE TO RELATED APPLICATIONS

This application is a continuation of and claims benefit of the filing date of U.S. patent application Ser. No. 16/827,459, filed Mar. 23, 2020 and titled "MONITORING CAPACITY OF A POWER BANK BATTERY AND DEVICES CHARGED THEREWITH," the entirety of which is hereby incorporated by reference herein.

FIELD OF THE INVENTION

The disclosure generally relates to apparatus and methods to detect a loss of capacity of a power bank battery and, more particularly, to communicate the loss of capacity of the power bank battery to a mobile computing device of a user of the power bank.

BACKGROUND

A power bank is a portable electronic device, chiefly including a rechargeable battery that is electrically connectable to one or more mobile computing devices. The power bank uses the electrical connection to supply electric charge to respective batteries of the mobile computing device(s). A user of a smartphone, for example, may carry a power bank so that, when the battery charge level of the smartphone is low, the user can connect the smartphone to the power bank (e.g., by USB or wireless charging means). Upon the power bank partially or fully recharging the smartphone battery, the user can continue to use the smartphone with less concern for depleting their smartphone battery.

Capacity of a power bank battery is typically expressed either in units of electric charge (e.g., milliampere-hours (mAh)) or units of energy (e.g., watt-hours (Wh)). Manufacturers of power banks typically advertise power banks by stating the initial capacity of the power bank, that is, how much charge or energy the power bank battery can hold at full charge (i.e., at full capacity of charge or energy), at the time the power bank is manufactured. This stated initial capacity of the power bank battery ("nominal capacity") is often large enough for the fully charged power bank to be able to provide multiple rechargings to mobile computing devices before the power bank battery is fully depleted. As an example, a fully charged power bank having a 10000 mAh battery capacity may provide multiple full or partial recharges to a smartphone having a battery capacity of ~3000 mAh, before the power bank is depleted and must be recharged.

However, it is understood that a power bank battery loses at least some of its capacity over time. Usually, these capacity losses are not reversible. As a result of capacity losses, the actual capacity of the example power bank battery may be substantially below the stated capacity of 10000 mAh (e.g., lower than 9000 mAh, 8000 mAh, 7000 mAh, etc.). Thus, the nominal capacity of the power bank battery may not be representative of the actual capacity of the power bank battery at a given time, particularly when the power bank has been owned or used for long periods of time. Over sufficient time, the capacity of the power bank battery may be reduced so significantly that the power bank cannot provide a full charging to a user's mobile computing device (e.g., the power bank's actual capacity has fallen to 2500 mAh, and is being used to charge a 3000 mAh smartphone battery). A power bank user may be frustrated when their power bank runs out of battery charge after providing substantially less charge to the mobile computing device battery than the user expects.

SUMMARY

One embodiment includes a portable power bank device ("power bank"). The power bank includes a rechargeable battery for supplying electric charge to a mobile computing device external to the power bank (e.g., a smartphone). The power bank is generally configured to supply electric charge to a mobile computing device external to the power bank via an electrical connection between the power bank battery and a battery of the mobile computing device. The power bank battery has a nominal capacity. The power bank further includes a communication module for exchanging communication signals (e.g., radio frequency communication signals) with the mobile computing device. The power bank still further includes a control module comprising one or more processors and a memory, the memory storing non-transitory computer executable instructions. The instructions, when executed, cause the power bank to (1) determine the nominal capacity of the power bank battery, (2) measure a present capacity of the power bank battery, (3) compare the present capacity of the power bank battery to the nominal capacity of the power bank battery to determine a health value of the power bank battery, and (4) transmit to the mobile computing device, via the communication module, an indication of the health value of the power bank battery when the health value is less than or equal to a threshold value.

Another embodiment includes a method performed via a power bank. The method includes determining, by a processor of the power bank, a nominal capacity of a rechargeable battery of the power bank. The power bank is generally configured to supply electric charge to a mobile computing device external to the power bank via an electrical connection between the power bank battery and a battery of the mobile computing device. The method further includes obtaining, by the processor, a measurement of a present capacity of the battery. The method still further includes comparing the present capacity to the nominal capacity to determine a health value of the power bank battery. Additionally, the method includes transmitting, via a communication module of the power bank, to a mobile computing device external to the power bank, an indication of the health value when the health value is less than or equal to a threshold value.

In accordance with the teachings of the disclosure, any one or more of the foregoing aspects of an apparatus or a method may further include any one or more of the following optional forms.

In one optional form, where the power bank's nominal capacity is rated in units of electric charge (e.g., milliampere-hours), measuring the present capacity includes monitoring an inflowing electric current to the power bank battery (e.g., measuring the inflowing electric current repeatedly over a time interval when the power bank is being charged). In this optional form, an input charge capacity of the power bank battery is calculated based upon the monitored inflowing electric current, and the present capacity is determined based upon the calculated input charge capacity. Alternatively, in another optional form, where the power bank's nominal capacity is rated in units of energy (e.g., Wh), measuring the present capacity includes monitoring power input to the power bank battery (e.g., repeatedly measuring power input to the power bank battery over the time interval, based upon measurements of inflowing current to the power bank battery and voltage of the power bank battery). In this optional form, an input energy capacity of the power bank battery is calculated based upon the monitored power input, and the present capacity is determined based upon the input energy capacity.

In another optional form, where the power bank's nominal capacity is rated in units of electric charge, measuring the present capacity includes monitoring an outflowing electric current from the power bank battery during a supply of electric charge from the power bank battery to the mobile computing device (e.g., by measuring the outflowing electric current repeatedly over a time interval corresponding to the supply of electric charge). In this optional form, an output charge capacity of the power bank battery is calculated based upon the monitored outflowing electric current, and the present capacity is determined based upon the calculated output charge capacity. Alternatively, in still another optional form, where the power bank's nominal capacity is rated in units of energy, measuring the present capacity includes monitoring power output from the power bank battery during a supply of electric charge from the power bank battery to the mobile computing device (e.g., by measuring the power output repeatedly over the time interval corresponding to the supply of electric charge, based upon measurements of voltage of the power bank battery and outflowing current from the power bank battery over the time interval).

In still another optional form, the power bank transmits the indication of the health value to the mobile computing device via wireless radio frequency (RF) communications.

In yet another optional form, the electrical connection between the power bank and the mobile computing device includes a wired electrical connection between the power bank and the mobile computing device.

In still another optional form, the electrical connection between the power bank and the mobile computing device includes a wireless electrical connection between the power bank and the mobile computing device.

In yet another optional form, the threshold value is a value defined by a user of the mobile computing device via an application executing at the mobile computing device.

Embodiments may further include non-transitory computer readable media comprising computer-executable instructions that cause a processor to perform a method via apparatus described herein.

Advantages will become more apparent to those skilled in the art from the following description of the preferred embodiments which have been shown and described by way of illustration. As will be realized, the present embodiments may be capable of other and different embodiments, and their details are capable of modification in various respects. Accordingly, the drawings and description are to be regarded as illustrative in nature and not as restrictive.

BRIEF DESCRIPTION OF THE DRAWINGS

The Figures described below depict various aspects of the system and methods disclosed herein. Each figure depicts a particular aspect of the disclosed system and methods, and each of the figures is intended to accord with a possible aspect thereof. Further, wherever possible, the following description refers to the reference numerals included in the following figures, in which features depicted in multiple figures are designated with consistent reference numerals.

There are shown in the Figures arrangements which are presently discussed, it being understood, however, that the present embodiments are not limited to the precise arrangements and instrumentalities shown, wherein.

Figure 1:
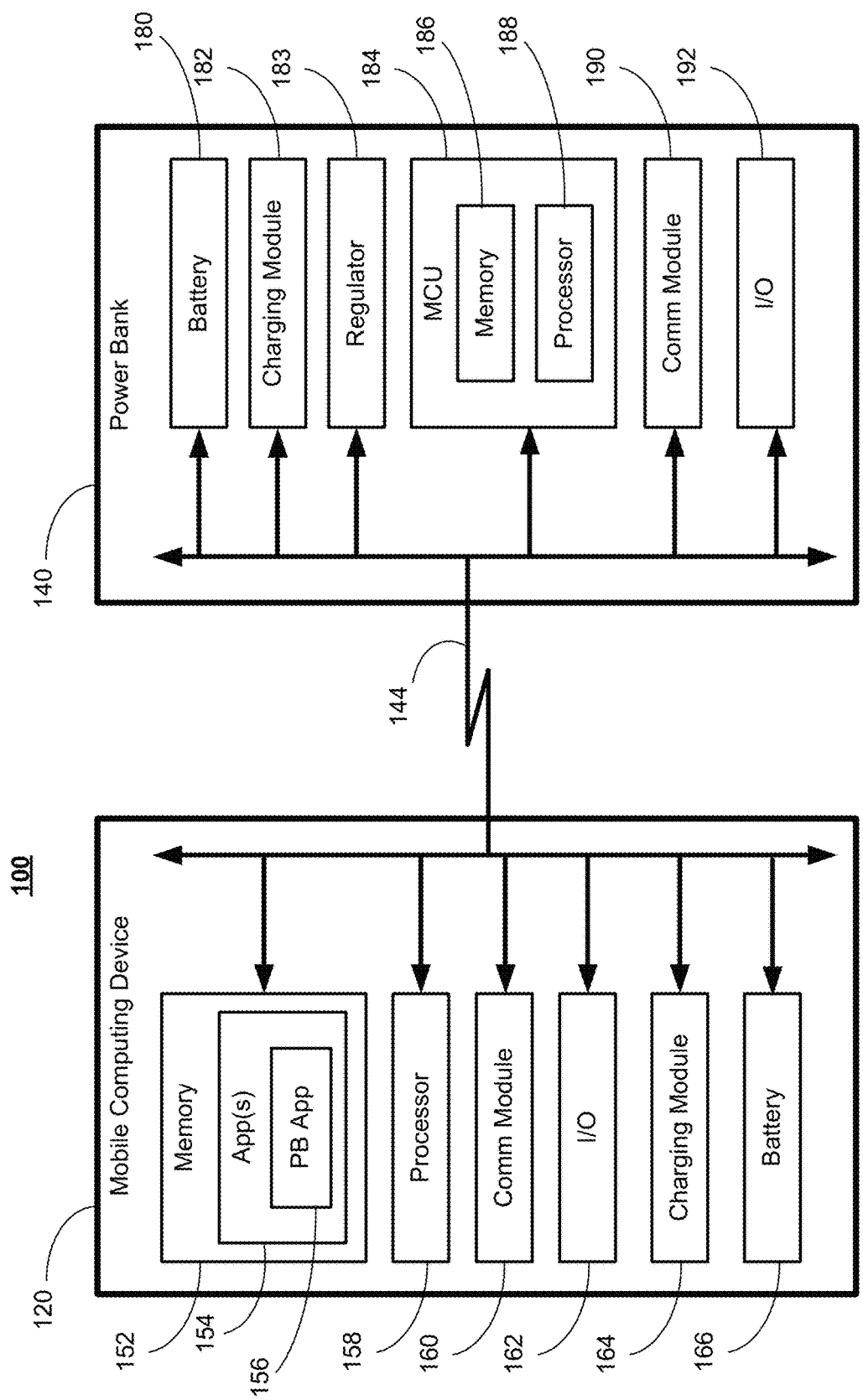
FIG. 1 illustrates an example computing environment including a power bank and a mobile computing device, in accordance with one aspect of the present disclosure.

The Figures depict preferred embodiments for purposes of illustration only. Alternative embodiments of the systems and methods illustrated herein may be employed without departing from the principles of the invention described herein.

DETAILED DESCRIPTION

Although the following text sets forth a detailed description of numerous different embodiments, it should be understood that the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Embodiments of the present disclosure include a portable power bank device ("power bank") and a mobile computing device (e.g., a smartphone). Each of the power bank and the mobile computing device include a respective internal battery ("power bank battery" and "mobile computing device battery," respectively). The power bank is configured to use its battery to supply electric charge to the mobile computing device battery, by way of an electrical connection between the power bank and the mobile computing device. The electrical connection may include, for example, a USB-C connection, micro USB connection, Lightning charging connection, a Qi-standard wireless connection, etc., and/or another wired or wireless structure for electrically connecting the mobile computing device to the power bank.

Embodiments of the present disclosure include, via the power bank, monitoring a state of health of the power bank battery, the state of health being based upon a comparison of the actual capacity of the power bank battery to a nominal capacity of the power bank battery. When a state of health of the power bank battery falls below a threshold value (e.g., 60%), the power bank battery transmits an indication of the health value to a mobile computing device associated with the power bank (e.g., via radio frequency (RF) communications). The mobile computing device is associated with the power bank, for example, by way of (1) being communicatively connection with the power bank (e.g., having established RF communications), and/or (2) being manually assigned to receive indications of state of health of the power bank (e.g., manually configured by a user of the mobile computing device via a mobile computing device application. The threshold value may be, for example, a value set by a manufacturer of the power bank, or a value set by a user of the power bank via a mobile computing device application in communication with the power bank. In any case, the indication transmitted by the power bank may cause the mobile computing device to display an indication of the state of health of the power bank battery (e.g., a push notification, and/or an image displayed on a screen of a mobile computing device application conveying the state of health information of the power bank).

Power bank users typically do not know when and how capacity losses occur in the power bank battery. Power bank capacity may decrease, for example, each time the battery is "cycled," e.g., each time the battery is depleted and recharged by a particular amount (5% of the battery's capacity, 15%, 55%, 100%, etc.). The exact loss of capacity due to cycling may vary, depending on the type of battery and how much of the battery is cycled. A number of additional factors may further contribute to capacity loss over time, even when the battery is not cycled. Capacity loss may increase, for example, when the battery is stored in extreme temperatures (e.g., significantly above or below 25 degrees Celsius), or depending on the charge level of the battery when the battery is stored for extended lengths of time. Furthermore, because capacity loss may occur even when the power bank is not used, some capacity loss may very well have already occurred by the time a user first acquires the power bank from a manufacturer or retailer (e.g., if significant time has elapsed from manufacturing until purchase). Because most consumer electronic devices measure present charge levels in comparison to actual capacity of the device battery, a fully charged power bank might indicate a charge level of "100%" even when the actual amount of charge or energy held by the power bank battery is significantly less than the nominal capacity of the power bank battery. Accordingly, a user of a power bank generally does not know, at any given time, the actual capacity of the power bank battery relative to the nominal capacity of the power bank battery. Consequently, a user may expect a power bank to deliver more charge or energy, based on prior actual experience, than the power bank is capable of delivering because of capacity loss. By advantageously transmitting an indication of the state of health of the power bank battery to the user, the power bank disclosed herein advantageously empowers the consumer to replace the power bank rather than continue to use a power bank having substantially reduced capacity (e.g., less than 70% of nominal capacity) and potentially incapable of delivering charge according to the user's established expectations.

Use of the methods and power banks described herein may improve the usefulness of the power bank relative to conventional power banks, at least because receiving an indication of the power bank's state of health allows the user to consider the state of health information and avoid unintentionally depleting the power bank battery earlier than expected. Furthermore, the methods and power banks described herein improve the user experience with the power bank, at least because reliable knowledge of the power bank state of health helps the user avoid being unexpectedly without a backup charge source for a mobile computing device.

Before further description, definitions of certain terms are provided, these terms being used throughout this detailed description.

As used herein, the term "power bank" refers to a portable electronic device usable for supplying electric charge to one or more mobile computing devices (e.g., a smartphone, a tablet, and/or a portable media player). The power bank chiefly comprises a rechargeable battery ("power bank battery"), such as a rechargeable lithium-ion or lithium-polymer battery. More particularly, the power bank battery includes one or more cells (e.g., electrochemical cells), which may be arranged in series, in parallel, or in an alternative aspect, include cells arranged in series and in parallel. The power bank may charge the mobile computing device (i.e., supply electric charge to the mobile computing device battery) via wired means for electrically connecting the power bank to the mobile computing device (e.g., USB or Lightning cable connection) and/or via wireless means for the same (e.g., Qi-standard wireless charging means). Means for electrically connecting the power bank to the mobile computing device are collectively referred to herein as an "electrical connection" between the power bank battery and the mobile computing device battery.

Capacity of a battery (e.g., of a rechargeable power bank battery) generally refers to a maximum electric charge or energy that can be held by the battery. Measured capacity of a battery may be expressed in units of electric charge (e.g., ampere-seconds, coulombs (C), milliampere-hours (mAh), and/or other suitable units) or in units of energy (e.g., watt-hours (Wh), joules (J), and/or other suitable units). "Nominal capacity" refers to an initial stated capacity of the battery (e.g., as stated by a manufacturer or retailer and corresponding to optimal capacity at the time of manufacture). "Actual capacity" refers to the battery's "real" or "true" capacity at a given time, and it will be understood that actual capacity will typically become less than nominal capacity and thus vary especially over a period of time. Actual capacity is typically measured in the same units as nominal capacity (e.g., when the battery's nominal capacity is rated in units of electric charge, the actual capacity is measured in the same). Actual capacity may be used in combination with a specific time to communicate the charge or energy held by the battery at that specific time, and thus two actual capacities determined at different times may be used to communicate the variance of charge or energy held by the battery over a time interval. "Present actual capacity" (or simply "present capacity") refers to the actual capacity of the battery at a present (current) time. "State of health" of the battery, as used herein, is a comparison of an actual capacity of the battery to a nominal capacity of the battery (e.g., actual capacity divided by nominal capacity, expressed as a ratio or percentage). The term "life percentage" may also be used to refer to the state of health of the battery. Where techniques are described herein in relation to batteries having capacities expressed in units of electric charge, it should be understood that similar techniques may be applied in relation to batteries having capacities expressed in units of energy, given appropriate modifications (which will be described herein).

"Fuel gauge," also referred to herein as "charge level," refers to the measured/determined amount of charge or energy held by a battery (e.g., rechargeable power bank battery, rechargeable smartphone battery, etc.) at a given time. Charge level may be expressed as a percentage, i.e., the percentage representation of the amount of charge held by the battery in comparison to a capacity of the battery. Mobile computing devices such as smartphones typically display their charge level in percentage form (e.g., 51%) for viewing by the user of the mobile computing device. It should be noted that, typically, a charge level of a battery is relative to the battery's present capacity, not the battery's nominal capacity. For example, if the present capacity of a given device battery is 8000 mAh compared to a nominal capacity of 10000 mAh, and the device indicates a present charge level of "100%," this means that the battery holds a charge of 8000 mAh (not 10000 mAh).

A "charging" or "recharging" of a given device, as used herein, is a supplying of electric charge to a rechargeable battery of the device, thereby increasing the charge level of the device. A charging may, for example, increase the device charge level from 0% to 100%, from 0% to 40%, from 51% to 63%, from 55% to 100%, etc. The act of charging over time is referred to herein as a "charging session." Conversely, a "depletion" of a given device (e.g., of the power bank) is a spending of electric charge by the device which thereby decreases the charge level of the device. Depletion of the device may, for example, reduce the device charge level from 100% to 0%, from 100% to 65%, from 80% to 20%, from 33% to 0%, etc.

"Power bank" may be used at points herein to more specifically refer to the power bank battery and thus, given the appropriate context, these terms may be considered interchangeable. For example, where the term "power bank" is described in relation to electricity, capacity, provision of charge, etc., the term should be understood as referring more specifically to the battery of the power bank (e.g., "capacity of the power bank," "receiving charge from the power bank," "charge level of the power bank," etc., specifically referring to the battery of the power bank). Similar terms may be used to describe a mobile computing device charged by the power bank (e.g., smartphone charged by the power bank). For example, terms such as "charging a mobile computing device" or "charge level of a mobile computing device" may refer more specifically to the battery of the mobile computing device.

A power bank according to this disclosure may include a microcontroller (MCU). At a very high level, computing functionalities of the power bank MCU are typically limited to the functionalities that relate to (1) provision of charge from the power bank to a mobile computing devices (e.g., allowing charge to be supplied, interrupting the supply of charge, etc.), and/or (2) calculations pertaining to characteristics of electricity which may be used in furtherance of provision of charge (e.g., measurements or calculations of power, energy, current, voltage, resistance, and capacity).

Although a power bank according to this disclosure may have some display capabilities (e.g., a blinking LED light or a power meter metric bar or display graphic indicative of power bank battery's charge level), the power bank according to this disclosure generally does not include a substantial display. For example, size of a power bank display screen may be limited such that the display screen does not have a viewing surface area greater than 25 cm$^2$, and/or greater than 16 cm$^2$. Additionally or alternatively, functionality of the power bank display screen is typically limited to only a simple numerical display (e.g., without the HD screen functionalities that are typically present in smartphones, tablets, notebook computers, etc.). As a result, the primary power draw from the power bank battery according to this disclosure is the charging of the mobile computing device (and not the operation of the limited power bank display itself, which requires substantially less power). Similarly, although a power bank as described herein may include some communication capabilities (e.g., RF communications, such as via Bluetooth Low Energy), wired and/or wireless communication functionalities of a power bank are typically limited to those functionalities which relate at least indirectly to provision of electric charge and/or communication of electrical characteristics to a mobile computing device associated therewith as described herein. In the power bank, these functionalities are performed via communications protocols that can be implemented at low power and low computing demand (e.g. Bluetooth Low Energy or WiFi), rather than more complex protocols that are less suitable for power banks and more suitable for mobile computing devices (e.g., cellular communications).

A power bank is typically limited in physical size, weight, and/or dimensions, such that the power bank can easily be carried by the user of a mobile computing device (e.g., in a pocket, purse, backpack, etc.). Often, the power bank has a physical size and weight comparable to that of a smartphone. However, other physical forms of power banks are possible. For example, some power banks are substantially larger in size and capacity, and thereby more effective for supplying more charge, e.g., capable of charging devices a greater number of times, capable of substantially charging larger devices such as laptop computers (e.g., providing sufficient charge to charge the laptop computer battery from 10% to 30%, 40%, 50%, 60%, or more).

Furthermore, as a result of functionalities of a power bank being limited to the functionalities described herein, the power bank generally has limited input/output (I/O) functionalities. For example, the power bank may not include a dedicated keyboard or touchpad. Additionally, although the power bank may include one or more ports (e.g., USB port, micro-USB port, etc., which may facilitate charging and/or data communications), typically, any ports included in the power bank are not adapted to receive a keyboard, mouse, peripheral touchpad, monitor or other peripheral I/O device.

Example Computing Environment

FIG. 1 illustrates an example computing environment 100 illustrating a power bank 140 according to this disclosure in which techniques described herein may be implemented. The environment 100 includes a mobile computing device 120, which may be a smartphone, tablet, wearable computing device, laptop computer, and/or other suitable computing device. The environment 100 further includes a power bank 140, which is generally configured to supply electric charge to one or more mobile computing devices (e.g., to the mobile computing device 120).

In addition to being electrically connected so that electric charge may be supplied from the power bank 140 to the mobile computing device 120, the mobile computing device 120 and power bank 140 may be communicatively connected via one or more communicative connections 144. The one or more communicative connections 144 may include a wireless radio frequency (RF) connection (e.g., via Bluetooth Low Energy (BLE), Zigbee, WiFi low Power, 6LoW-PAN, and/or other suitable protocols). Additionally or alternatively, the one or more communicative connections may be implemented by a wired connection between the power bank 140 and the mobile computing device 120 (e.g., via wired USB or Lightning cable connection). In some embodiments, a single connection between the mobile computing device 120 and power bank 140 (e.g., a USB data/charging wired connection) may both electrically and communicatively connect the power bank 140 to the mobile computing device 120 and thereby facilitate a combination of communication and charging capabilities between the mobile computing device 120 and the power bank 140.

The mobile computing device 120 includes a memory 152 (i.e., one or more memories 152, e.g., RAM, ROM, etc.). The memory 152 includes one or more applications 154 ("App(s)"), each of which comprises one or more sets of non-transitory computer-executable instructions. In particular, the one or more applications 154 includes a power bank application 156 ("PB App"), which may, for example, facilitate measuring and/or viewing of state of health of the power bank 140. In some embodiments, the one or more applications 154 use an application programming interface (API) that provides access to electrical characteristics of the mobile computing device 120, which are measured via internal circuitry of the mobile computing device 120 (e.g., voltage, current, resistance, etc.).

The mobile computing device 120 further includes a processor 158 (i.e., one or more processors, e.g., CPU, GPU, etc.), which may execute the non-transitory computer executable instructions included in the memory 152. The mobile computing device additionally includes a communication module 160 ("Comm Module"), which may establish communications and exchange communication signals with the power bank 140 via the one or more communicative connections 144. Communication signals to and/or from the communication module 160 may include wireless signals (RF signals) or wired communication signals (e.g., via USB data connection). The mobile computing device still additionally includes an I/O 162 for connecting one or more input devices and/or one or more output devices (e.g., a dedicated display screen such as a touchscreen).

The processor 158 of the mobile computing device 120 may particularly include an analog to digital converter (ADC) configured to convert analog measurements of voltage, current, resistance, and/or other electrical characteristics at the mobile computing device 120 to digital values. Digital values can be transmitted via the communication module 160 to the power bank 140 via the one or more communicative connections 144 (e.g., via a wireless RF connection).

The mobile computing device 120 includes a charging module 164 (e.g., a USB charger) chiefly configured to receive electric charge and direct the electric charge to a rechargeable battery 166 of the mobile computing device 120 ("mobile computing device battery 166"). The battery 166 is the primary power source of the mobile computing device 120. Usually, the battery 166 is internal to the mobile device 120 (e.g., fixedly or removably placed inside a cavity of the mobile computing device 120).

The charging module 164 may include one or more charging ports (e.g., USB port or Lightning port) and/or additional circuitry for receiving and directing electric charge to the battery 166 when the charging module 164 receives electric charge from an external power supply (i.e., a supply of electric charge). The external power supply may be the power bank 140 according to the disclosure and/or another external power supply (e.g., a wall outlet, a vehicle charging port, etc.).

Operations of the processor 158 may include operations for managing the supply of electric charge to the battery 166 via the charging module 164 (e.g., operating a switch to interrupt and/or resume the supply of electric charge from the power bank 140 to the battery 166).

In some embodiments described herein, the charging module 164 is coupled to a voltage regulator (e.g., a DC-to-DC voltage converter). The voltage regulator may be configured, for example, to convert the voltage of a charging port of the mobile computing device 120 to a voltage of the battery 166. For example, in a mobile computing device 120 that is configured to receive power via a 5 volt (5V) USB charging port, the voltage regulator may include a step-down converter ("buck converter") configured to reduce the USB voltage to 3.6V or another suitable voltage corresponding to the battery 166. Similar voltage conversion may be performed based upon (1) the voltage of components of the charging module 164, which may vary based upon the charging means used (e.g., Lighting charging, Qi-standard wireless charging means, etc.), and (2) the voltage across two terminals of the mobile computing device battery 166. Additional description of components of the charging module 164 will be provided with respect to FIG. 2.

Still referring to FIG. 1, the power bank 140 includes a rechargeable battery 180. The power bank battery 180 is the primary power source of the power bank 140 itself, and is also the power source by which the power bank 140 supplies charge to mobile computing devices. The power bank battery 180 may be, for example, a lithium-ion battery, a lithium-polymer battery, and/or another type of secondary battery. The power bank battery 180 may comprise one or more electrochemical cells, connected in parallel and/or in series.

The power bank 140 includes at least one charging module 182 (e.g., a USB charger), which generally is configured to (1) receive and direct electric charge to the power bank battery 180 (e.g., charge received from an AC wall outlet, vehicle charging port, etc.), and (2) supply electric charge via an electrical connection to one or more mobile computing devices. Two or more charging modules 182, for example, in one specific implementation, three charging modules 182 may be included to allow recharging of the battery while simultaneously permitting charging of two mobile computing devices. In possible embodiments, the electrical connection may be implemented via wired and/or wireless means (e.g., USB charging, Lightning charging, Qi-standard wireless charging means, and/or other suitable means).

The charging module 182 may be coupled to a voltage regulator 183 (e.g., a DC-to-DC voltage converter). The voltage regulator 183 may be configured, for example, to convert a first voltage associated with a power source of the power bank 140 (e.g., a 120V AC wall outlet) to a second voltage of the power bank battery 180 (e.g., 3V, 3.6V, or 4.2V) while the power bank 140 is being recharged. Additionally or alternatively, the voltage regulator 183 may be configured to convert the voltage of the power bank battery 180 to still another voltage of a charging connection to the mobile computing device 120 (e.g., the voltage regulator may include a step-up or "boost" converter configured to convert the power bank voltage to 5V for a USB charging connection) while the power bank 140 is supplying charge to the mobile computing device 120. Voltage conversion within the power bank 140 may vary based upon (1) the voltage of the power bank battery 180, and (2) the voltage associated with the charging means by which charge is provided to the mobile computing device 120 (e.g., Lighting charging, Qi wireless charging, etc.). Additional description of components of the charging module 182 will be provided with respect to FIG. 2.

The power bank 140 includes a microcontroller 184 (MCU, also referred to herein as a control module) comprising a memory 186 and a processor 188. The memory 186 (i.e., one or more memories) may include ROM, RAM, and/or other suitable types of computer memory. The processor 188 (i.e., one or more processors) may include a CPU and/or other suitable processing unit(s), which executes non-transitory instructions stored at the memory 186. In various embodiments, the MCU 184 performs measurements of electrical characteristics via the charging module 182 (e.g., measurements of voltage of the battery 180, outflowing current from the battery 180, and/or other measurements described herein) and performs calculations based upon the values obtained via the performed measurements. Furthermore, the MCU 184 may control operations of the charging module 182 (e.g., operating a switch therein to interrupt and/or resume a supply of electric charge to the power bank battery 180 from an external power source, and/or a supply of charge from the power bank 140 to the mobile computing device battery 166).

The power bank 140 additionally includes a communication module 190 ("Comm Module") configured to exchange wired and/or wireless communication signals with the mobile computing device 120 via the one or more communicative connections 144 (e.g., RF digital communications using Bluetooth Low Energy, WiFi, etc.). The communication module 190 may include a digital radio transceiver. Non-transitory instructions stored at the power bank memory 186 may include instructions that, when executed by the processor 188, cause the communication module 190 to transmit indications of measured electrical characteristics and/or other calculations performed by the MCU 184 (e.g., indications of voltage, current, resistance, etc.) to the mobile computing device 120.

The MCU 184 may particularly include an analog to digital converter (ADC) configured to convert analog measurements of voltage and/or other electrical characteristics at the power bank 140 to digital values. Digital values can be transmitted via the communication module 190 to the mobile computing device 120 via the one or more communicative connections 144 (e.g., via a wireless RF connection).

Optionally, the power bank includes an I/O 192 for connecting one or more input devices and/or one or more output devices. In particular, the I/O 192 may include a power button which controls interruption/resumption of a supply of charge from the power bank battery 180 to a battery of a mobile computing device (e.g., to the battery 166 of the mobile computing device 120). In some embodiments, the I/O 192 may include one or more light emitting diodes (LEDs) and/or other graphical output, which may for example be an icon providing an indication of the charge level of the power bank battery 180 and/or whether charging is actively taking place.

The environment 100 may include additional computing devices and/or components, in various embodiments. Moreover, where components of a device described herein are referred to separately, it should be understood that components may be combined, in some embodiments.

Figure 2:
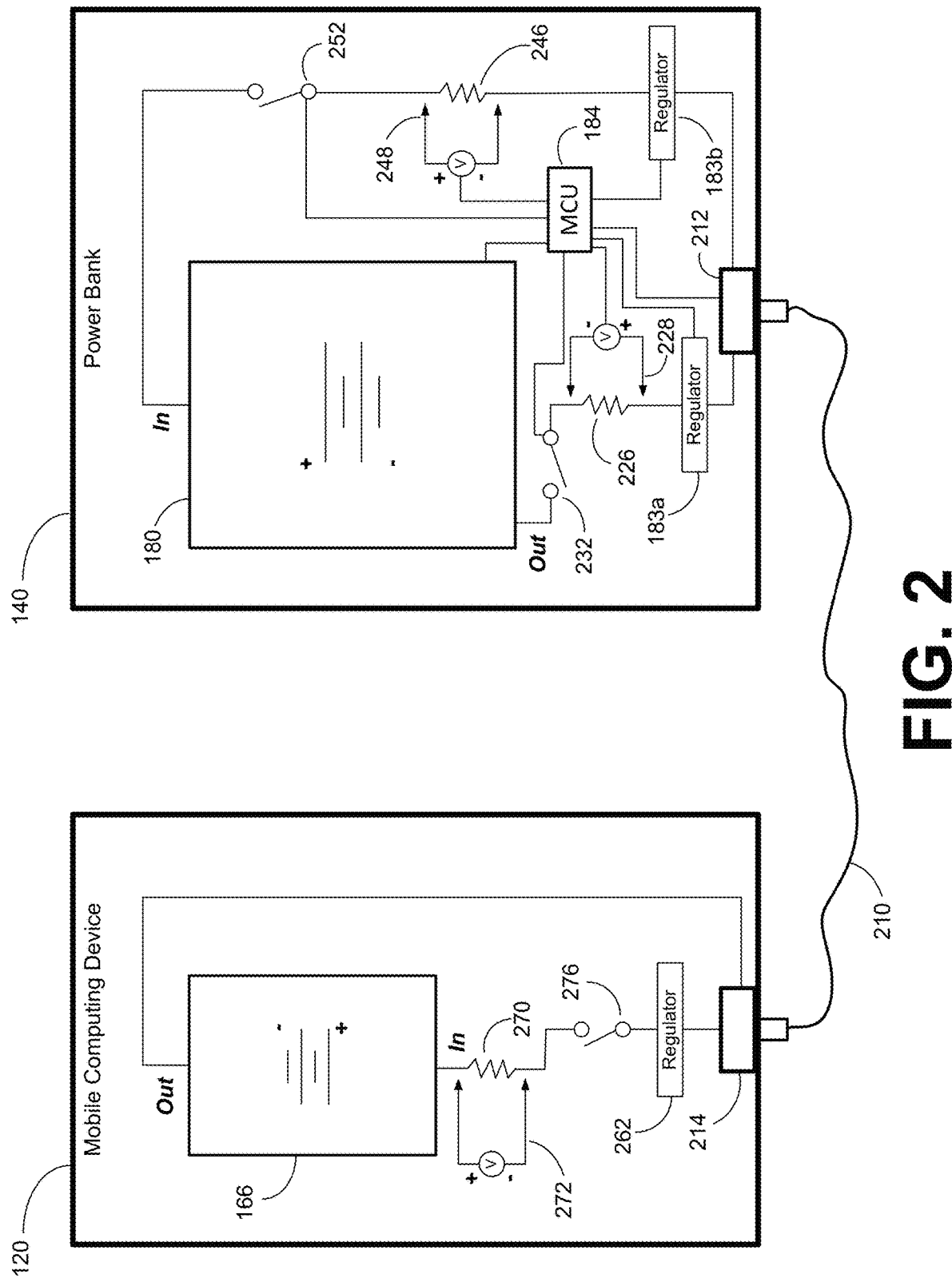
FIG. 2 illustrates example components of the power bank and the mobile computing device of FIG. 1, in accordance with one aspect of the present disclosure.

FIG. 2 illustrates example conventionally known electrical components of the mobile computing device 120 and power bank 140 of FIG. 1, suitable for use in the portable power bank devices described herein. Although a limited number of electrical components are described with respect to FIG. 2, these are merely provided for general illustration of the power banks 140 and methods described herein, and thus it should be understood that the mobile computing device 120 and/or power bank 140 may include additional, fewer, and/or alternate components to those described herein, in various embodiments (e.g., other electrical circuitry, and/or any of the components described with respect to FIG. 1). Thus, arrangements of the electrical components generally described herein may vary from the arrangement shown in FIG. 2.

At a high level, electrical components depicted in FIG. 2 facilitate supply of electric charge from the power bank battery 180 to the mobile computing device battery 166 via an electrical connection between the power bank battery 180 and the mobile computing device battery 166. The electrical connection between the power bank battery 180 and the mobile computing device battery 166 electrically connects the respective batteries thereof to facilitate the supply of charge from the power bank battery 180 to the mobile computing device battery 166. In some embodiments, at least some the electrical components described herein may be disposed in one or more integrated circuits in the mobile computing device 120 and/or in the power bank 140.

In the embodiment shown in FIG. 2, the electrical connection 210 is a wired electrical connection (e.g., a USB-C charging cable, micro-USB cable, Lighting cable, or other physical connecting structure) that connects an electrical port 212 of the power bank 140 to an electrical port 214 of the mobile computing device 120. Additionally or alternatively, in some embodiments, the electrical connection 210 may include a wireless electrical connection (e.g., Qi-standard wireless charging connection). Moreover, in some embodiments, the electrical connection 210 may be implemented by the same structure that provides the communicative connection(s) 144 as described with respect to FIG. 1. That is, a single connection between the mobile computing device 120 and the power bank 140 (e.g., a USB wired data/charging wired connection) may both electrically and communicatively connect the mobile computing device 120 and the power bank 140.

The power bank battery 180 supplies electric charge via an outflowing electric current from the power bank battery 180. A power output of the power bank battery 180 can be calculated (e.g., by the power bank MCU 184) by multiplying a value of the outflowing electric current by a voltage of the power bank battery 180. Voltage of the power bank battery 180 (e.g., voltage across two terminals of the power bank battery 180) may be measured, for example, by the MCU 184 via a voltmeter disposed at the power bank battery 180. Outflowing current may be measured by the MCU 184 via use of a resistor 226 (e.g., a shunt resistor) which is electrically arranged in series with the power bank battery 180, and which has a known resistance. When current passes through the resistor 226, the MCU 184 measures a voltage drop across the resistor 226 via a voltmeter 228. The ADC in the power bank MCU (e.g., MCU 184) may convert analog voltmeter measurements in the power bank 140 to digital voltage measurements. The MCU 184 may divide the voltage drop across the resistor 226 by the known resistance of the resistor 228 to determine the value of the electric current passing through the resistor 226 (and hence, the outflowing current of the power bank battery 180).

In some embodiments, control of the supply of electric charge from the power bank battery 180 is facilitated via a power bank switch 232. The switch 232 in an open state (as shown in FIG. 2) prevents the supply of electric charge from the power bank battery 180, whereas the switch 232 in a closed state allows the supply of electric charge. The switch 232 may be controlled, for example, by the MCU 184. Additionally or alternatively, in some embodiments, the switch 232 may be controlled based upon communications transmitted to the power bank 140 by the mobile computing device 120, which communications may be based upon corresponding user input.

The power bank 140 includes a voltage regulator 183a (e.g., the voltage regulator 183 as shown in FIG. 1, for example a DC-to-DC voltage converter). The voltage regulator 183a may be configured to convert a first voltage of the power bank battery 180 (e.g., 3V, 3.6V, or 4.2V) to a second configured voltage of the electrical connection 210 (e.g., 5V for USB charging). Accordingly, in some embodiments, the voltage regulator 183a includes a step-up or "boost" converter configured to increase the voltage. Additionally or alternatively, in some embodiments, the voltage regulator 183a includes a step-down or "buck" converter to decrease the voltage (e.g., when the power bank battery 180 voltage is greater than the electrical connection 210 voltage). Effectively, voltage regulation by the voltage regulator 183a may vary based upon (1) the voltage of the power bank battery 180, and (2) the voltage associated with the electrical connection 210. Regulated electric current (e.g., having passed through the voltage regulator 183a) may be supplied to the electrical connection 210 by way of the power bank electrical port 212. Notably, by performing the measurement of outflowing current between the battery 180 and the voltage regulator 183a, the outflowing current measurement reflects outflowing current from the battery 180 itself (e.g., outflowing current from a terminal of the battery 180), thereby avoiding inaccuracies that may be caused by losses of energy and/or changes in value of the current occurring at the voltage regulator 183a.

The power bank 140 may additionally include a second, separate electrical pathway for facilitating supply of inflowing electric charge to the power bank battery 180 (e.g., inflowing electric charge from an AC wall outlet, vehicle charging port, and/or other source of charge for the power bank 140). Elements of this second pathway may generally be similar to the elements described herein for directing outflowing electric charge from the power bank battery 180. Accordingly, the second pathway may include, for example, a voltage regulator 183b (e.g., to convert a first voltage of an electrical connection supplying charge to the power bank 140, to a second voltage of the power bank battery 180). Electrical current, upon passing through the voltage regulator 183b may pass through a resistor 246 (e.g., a shunt resistor). Electric current passing through the resistor 246 may be measured in a manner similar to that described herein regarding outflowing current through the resistor 226 (e.g., by the MCU 184 via a voltmeter 248). Supply of inflowing electric charge to the battery 180 may be controlled via a switch 252. Notably, by performing the measurement of inflowing current between the battery 180 and the voltage regulator 183b, the inflowing current measurement reflects the inflowing current to the battery 180 itself (e.g., current passing into a terminal thereof), thereby accounting for potential losses of energy and/or changes in value of the current occurring at the voltage regulator 183b. Power input to the power bank battery 180 can be calculated (e.g., by the power bank MCU 184) by multiplying a value of the inflowing electric current by a voltage of the power bank battery 180 (e.g., voltage across two terminals of the power bank battery).

Electrical current is received at the mobile computing device 120 from the electrical connection 210 by way of the mobile computing device port 214. The received electrical current may flow to a voltage regulator 262 of the mobile computing device 120. The voltage regulator 262 may be configured to convert the voltage of the electrical connection 210 (e.g., 5V for USB charging) to another voltage of the mobile computing device battery 166 (e.g., 3V, 3.6V, or 4.2V). Accordingly, in some embodiments, the voltage regulator 262 includes a step-down converter configured to decrease the voltage. Additionally or alternatively, in some embodiments, the voltage regulator 262 includes a step-up converter configured to increase the voltage.

Electric charge is received at the mobile computing device battery 166 by way of an inflowing electric current. Voltage of the mobile computing device battery 166 may be measured, for example, by a voltmeter in the battery 166. The value of the inflowing electric current may be measured via a resistor 270 (e.g., a shunt resistor) which is electrically arranged in series with the mobile computing device battery 166, and which has a known resistance. When current passes through the resistor 270, the mobile computing device 120 measures a voltage drop across the resistor 270 via a voltmeter 272. The ADC in the mobile computing device processor may convert analog measurements of voltage in the mobile computing device 120 to digital voltage values. The processor of the mobile computing device (e.g., processor 158) may divide the voltage drop across the resistor 270 by the known resistance of the resistor 270 to determine the value of the electric current passing through the resistor 270 and hence, the value of the inflowing current to the mobile computing device battery 166.

In some embodiments, control of the supply of electric charge to the mobile computing device battery 166 is performed via a mobile computing device switch 276. The switch 276 in an open state (as shown in FIG. 2) prevents the supply of electric charge to the mobile computing device battery 166, whereas the switch 276 in a closed state allows the supply of electric charge. The switch 276 may be controlled, for example, by the processor of the mobile computing device 120 (e.g., processor 158). Additionally or alternatively, in some embodiments, the switch 276 may be controlled based upon communications transmitted to the mobile computing device 120 by the power bank 140.

Measuring State of Health of a Power Bank Battery

Generally, a state of health of the power bank is defined as a value representing an actual capacity of the power bank battery compared to the nominal capacity of the power bank battery (e.g., a ratio or percentage). This value is referred to herein as a "health value" of the power bank battery. Accordingly, in this detailed description, "state of health" and "health value" are used interchangeably.

For example, in a power bank battery having a present capacity of 8400 mAh compared to a nominal capacity of 10000 mAh, the health value of the power bank may be expressed as 0.84 or 84%, i.e., indicating that the power bank battery has a present capacity that is 84% of its nominal capacity. According to techniques described herein, when the health value falls at or below a predetermined threshold, the power bank (e.g., power bank 140 from FIGS. 1 and 2) may transmit an indication of the health value to a mobile computing device of a user (e.g., mobile computing device 120 from FIGS. 1 and 2). The indication, upon being received by the mobile computing device, causes the mobile computing device to display an indication of the health value (e.g., a push notification, and/or an image displayed on a screen of an application at the mobile computing device. The display at the mobile computing device may indicate the state of health of the power bank, thereby providing the user an opportunity to account for the state of health when charging his or her device(s) (e.g., to charge the power bank more often to ensure that the power bank is not inadvertently and inconveniently depleted based on set prior expectations of the user), or to replace the power bank. As will be described below, various techniques may be utilized to determine the nominal capacity, actual capacity, and health value of the power bank battery.

First, determining the state of health of the power bank battery includes determining the nominal capacity of the power bank battery. Typically, the power bank is aware of its own nominal capacity (e.g., the nominal capacity is stored in the non-transitory power bank memory 186 at time of manufacture). In some embodiments, the nominal capacity of the power bank battery is a combined capacity based upon a multi-cell configuration of two or more cells of the power bank battery (e.g., electrochemical cells), each having an individual capacity. In any case, the nominal capacity of the power bank battery can be represented as a single value, i.e., a nominal combined capacity of one or more cells in the power bank battery (e.g., 5000 mAh, 10000 mAh, 22000 mAh, etc.).

Second, determining the state of health of the power bank battery includes determining the actual capacity of the power bank battery (e.g., determining the present actual capacity). Multiple techniques are possible for determining actual capacity of the power bank battery, as will be described below.

Determining Actual Capacity of a Power Bank Battery

In one possible embodiment, when the power bank battery's capacity is rated in units of electric charge, "coulomb counting" techniques are used in combination with measurements of voltage of the power bank battery during charging and/or draining of the power bank battery. Generally, coulomb counting comprises measuring the outflowing current from the power bank battery and/or inflowing current to the power bank battery over a time interval. Outflowing electric current from the power bank (i.e., carrying electric charge out of the power bank battery, e.g., via circuitry of the power bank as described with respect to FIG. 2) may be measured, for example, while the power bank is supplying charge to one or more mobile computing devices. Inflowing electric current (i.e., carrying electric charge into the power bank battery) may be measured, for example, while the power bank is receiving charge from an AC wall outlet, vehicle charging port, and/or other source of charge for the power bank. Measured inflowing or outflowing current can be integrated over a time interval to determine the total inflowing or outflowing electric charge over the time interval. In some circumstances, if the measured current is constant over a time interval (or if varying current is averaged over the time interval), the constant current or average current may be multiplied by duration of the time interval to determine the total current (inflowing or outflowing) over the time interval.

In some embodiments, the power bank MCU measures outflowing and/or inflowing electric current via use of a resistor electrically arranged in series with the power bank battery (e.g., a shunt resistor 226 for measuring outflowing current, or another shunt resistor similarly arranged for measuring inflowing current, as described with respect to FIG. 2). The resistor has a known electrical resistance (e.g., 0.01 Ohms (a)), and the electrical resistance of the resistor is included in memory of the power bank MCU. The power bank MCU measures voltage drop across the resistor. For example, for the 0.0152 shunt resistor, the MCU may measure a drop of 20 millivolts (mV) across the shunt resistor. The MCU divides the voltage drop by the known resistance of resistor to determine the electric current passing through the resistor (and hence, the current flowing to or from the power bank battery). For example, for the MCU measuring a drop of 20 mV across the 0.0152 shunt resistor, the MCU determines an electric current of 2 A. The MCU continues to monitor the electric current as a function of time over a time interval (via continued measurements of voltage drop across the shunt resistor). The monitored electric current is integrated or multiplied over the time interval to determine the total amount of inflowing or outflowing electric charge over the time interval.

Preferably, the time interval over which total charge is calculated corresponds to at least one of (1) a full charging of the power bank battery (i.e., from ~0% fuel gauge to ~100% fuel gauge, by charging from a wall outlet or other source) and/or (2) a full draining of the power bank battery (i.e., from ~100% fuel gauge to 0% fuel gauge, upon charging one or more mobile computing devices). As will be described below, a full charging and/or full draining of the power bank battery is detected by monitoring of voltage and/or current at the power bank battery.

Monitoring a full charging of the power bank battery (0% to 100%) typically involves monitoring a "Constant Current/Constant Voltage" (CC/CV) charging of the power bank battery. CC/CV charging of the power bank battery can be understood from FIG. 3, which charts inflowing current to the power bank battery as a function of the fuel gauge of the power bank battery during charging (and hence, as a function of time).

Figure 3:
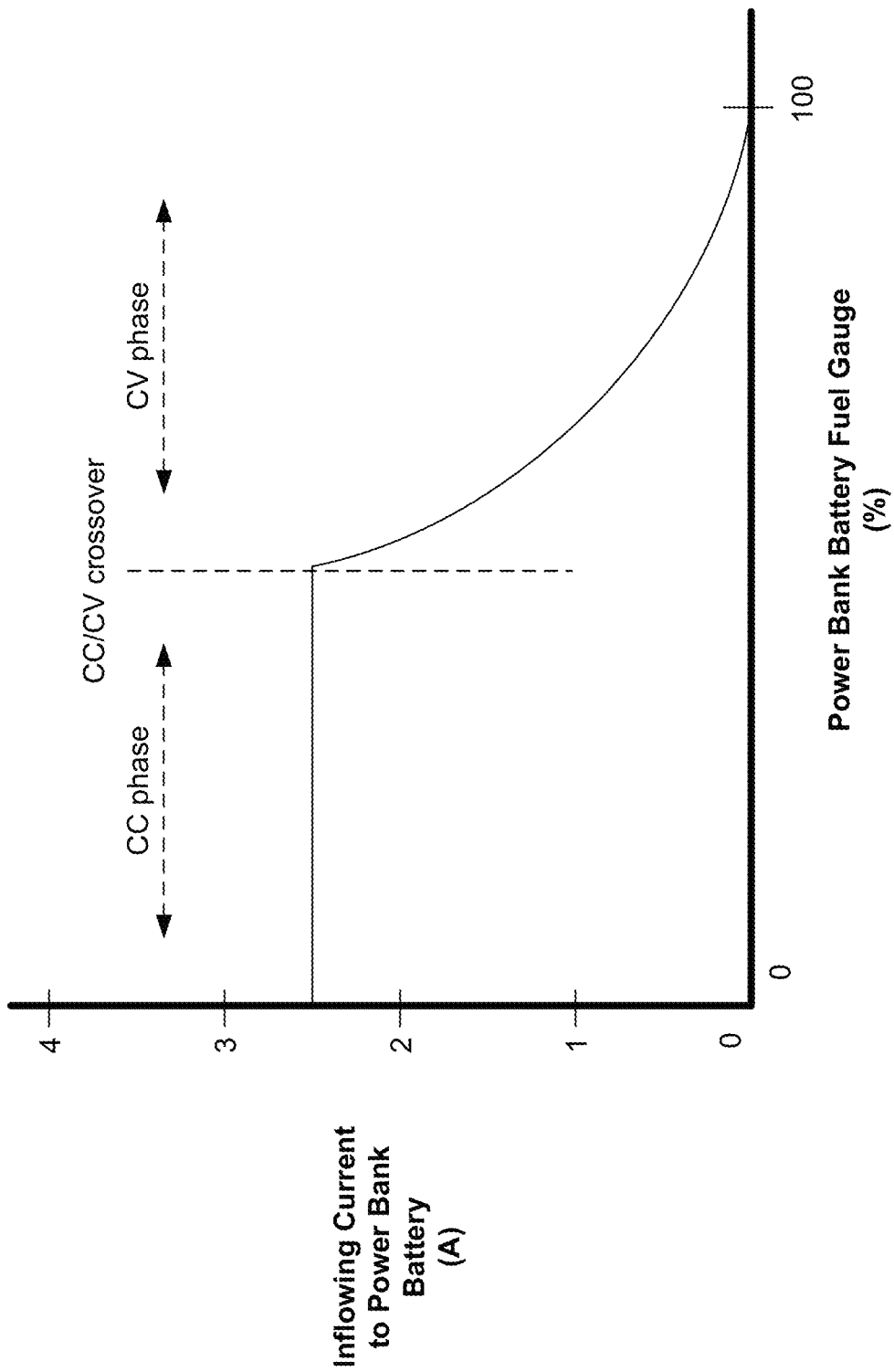
FIG. 3 illustrates an example chart associated with electric current measured at a power bank, in accordance with one aspect of the present disclosure.

In a first "Constant Current" (CC) charging phase, shown in FIG. 3, when a fully depleted power bank is connected an external power supply (not shown), the power bank battery receives an inflowing electric current of a substantially constant magnitude (e.g., 2.5 A), and the internal voltage of the power bank battery increases from a minimum rated voltage (e.g., 3V at 0% fuel gauge, in the case of many lithium-ion batteries) to a maximum rated voltage (e.g., 4.2V for lithium-ion batteries). The maximum voltage of the power bank battery may be achieved, for example, when the power bank battery is at 50% battery fuel gauge, 60% fuel gauge, 70%, 80%, or another charge level. In any case, once the power bank battery reaches maximum voltage, the second "Constant Voltage" (CV) charging phase, shown in FIG. 4, begins. In the CV phase, the maximum voltage of the power bank battery is maintained while the inflowing current decreases from an initial value (e.g., 2.5 A in the moment immediately after crossover to CV charging from CC charging) to near-zero inflowing current as the power bank fuel gauge approaches 100%. When the inflowing current is equal to or below a predetermined threshold that signifies that charging has tapered off sufficiently (e.g., 0.05 A), the power bank MCU determines that the fuel gauge is ~100%, and the second and final charging phase is complete. Consequently, the MCU causes cutoff of the supply of charge to the power bank (e.g., via the switch in the power bank or in a charging adaptor in the power bank's power supply).

An "input charge capacity" of the power bank battery is determined via monitoring the inflowing current over the first and second phases of a CC/CV full charging of the power bank. Particularly, the inflowing current is integrated over the duration of the full charging of the power bank from 0% to 100% (e.g., 80 minutes, which may be continuous or non-continuous). Integration of the inflowing current over time produces the total electric charge inflowing to the power bank battery over the duration of the charging session. As an example, in a power bank having a nominal capacity of 10000 mAh, the power bank MCU may determine that the power bank battery received only 7400 mAh to fully charge from 0% to 100% fuel gauge. Thus, the MCU determines that the input capacity of the power bank is 7400 mAh.

Conversely, the power bank MCU may determine actual capacity by monitoring power bank battery voltage and outflowing current during a full draining of the power bank battery (from 100% to 0% fuel gauge), while the power bank supplies electric charge to one or more mobile computing devices. Particularly, the power bank MCU may monitor the outflowing current from the power bank battery by measuring voltage drop across the shunt resistor in series with the power bank battery. The value of the outflowing current during draining generally may vary based upon various factors, including for example the fuel gauge of the device(s) to which the power bank is supplying charge.

Figure 4:
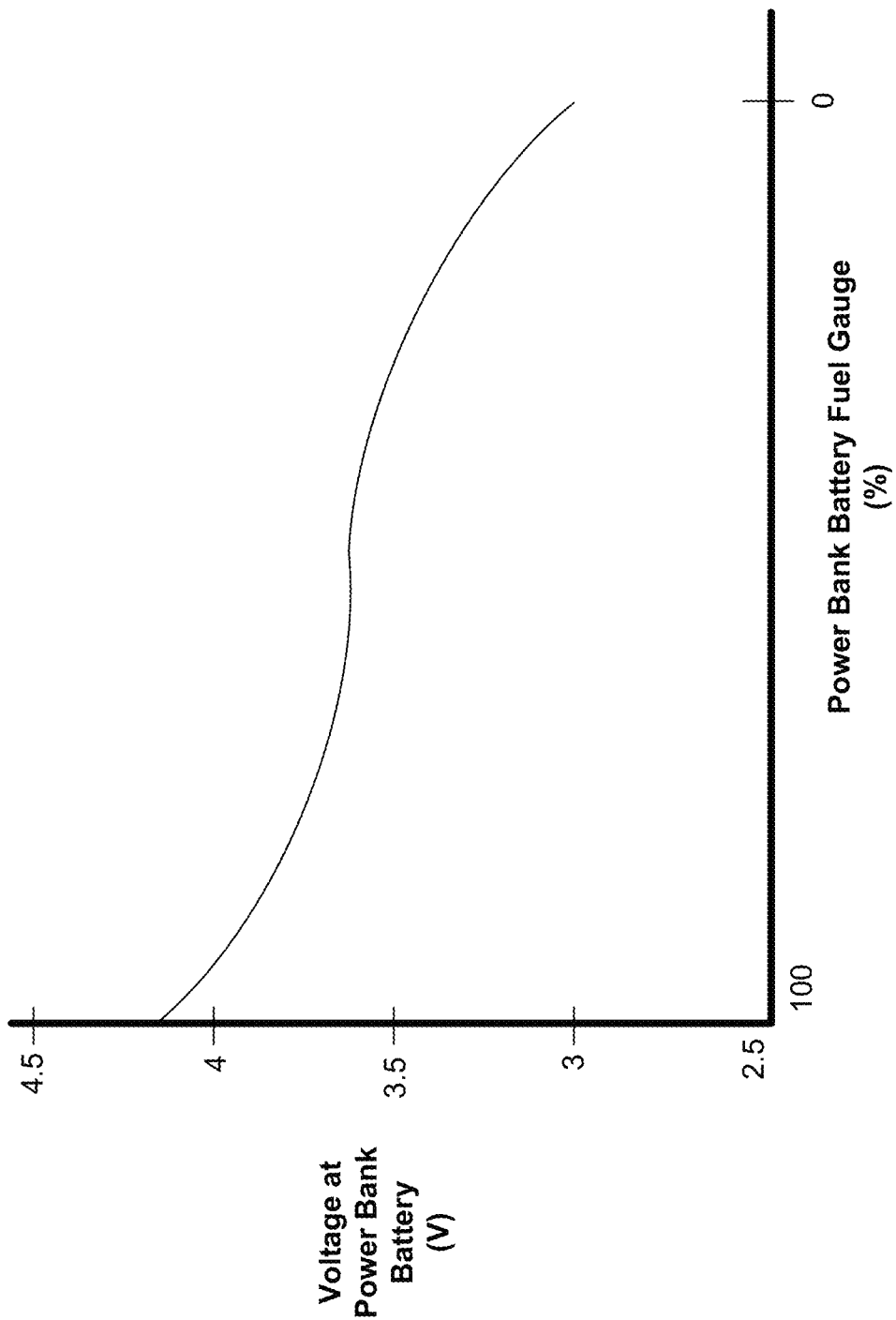
FIG. 4 illustrates an example chart associated with voltage measured at a power bank, in accordance with one aspect of the present disclosure.

Behavior of voltage of the power bank battery can be understood from FIG. 4, which charts voltage of the power bank battery as a function of the fuel gauge of the power bank battery as the power bank battery drains over time (e.g., while charging one or more mobile computing devices). As the power bank battery drains, the power bank battery voltage decreases from its maximum voltage (e.g., 4.2V, as shown in FIG. 4) toward its minimum voltage (e.g., 3V). The power bank MCU monitors the current and/or voltage until the power bank voltage is equal or near equal to the minimum voltage, which indicates that the power bank battery fuel gauge is at or very close to 0%.

An "output charge capacity" of the power bank battery is determined by integrating the outflowing current over a duration over which the power bank battery supplied charge (e.g., drained from 100% to 0% fuel gauge). As an example, in the power bank having a nominal capacity of 10000 mAh, the power bank MCU may determine that the power bank battery drained only 7000 mAh to drain from 100% to 0% fuel gauge. Thus, the MCU determines that the "output capacity" of the power bank is 7000 mAh.

Determinations of input charge capacity and output charge capacity are preferably used when the nominal capacity of the power bank battery is expressed in units of electric charge (e.g., mAh). That is, actual capacity is measured in units comparable to those of the nominal capacity. Thus, in embodiments where the nominal capacity of the power bank battery is rated in units of energy (e.g., Wh), the actual capacity should likewise be measured units of energy (rather than in units of charge, as is achieved via the coulomb counting techniques as described above).

Accordingly, in embodiments where the nominal capacity of the power bank battery is expressed in units of energy, "energy counting" techniques are used to measure the actual capacity. The power bank MCU may measure outflowing current from the power bank and/or inflowing current to the power bank in combination with voltage of the power bank battery over a time interval. As in coulomb counting as described herein, the time interval preferably corresponds to at least one of a full charging of the power bank battery or a full draining of the power bank battery (which may be detected in the same manner as described above with respect to FIGS. 3 and 4). The MCU may multiply the measured outflowing or inflowing current by corresponding voltage (that is, voltage of the power bank battery at the same time) to determine the power input to the power bank battery or power output of the power output of the power bank battery at a given time during the time interval. Alternatively, in some embodiments, all measurements of outflowing or inflowing current over the time interval may be multiplied by a same "average voltage" of the power bank battery (e.g., a nominal voltage of the battery).

The power bank MCU may integrate the measured power input or power output over the time interval to determine the total inflowing energy to the power bank battery over the time interval, or the total outflowing energy from the power bank battery over the time interval. The MCU may measure an "input energy capacity" of the power bank battery by monitoring the inflowing energy to the power bank battery over a full charging of the power bank from substantially 0% to substantially 100% fuel gauge. For example, in a power bank having a nominal capacity of 50 Wh, the power bank MCU may determine that the power bank battery only received 40 Wh to charge from 0% to 100%. Additionally or alternatively, the power bank MCU may measure an "output energy capacity" of the power bank battery by monitoring the outflowing energy from the power bank battery over a full draining of the power bank from 100% to 0% fuel gauge. For example, in the power bank having a nominal capacity of 50 Wh, the power bank MCU may determine that the power bank battery only drained 38 Wh to drain from substantially 100% to substantially 0% fuel gauge.

In any case, the power bank MCU may determine the actual capacity of the power bank battery based upon either of the calculated input capacity (e.g., input charge or energy capacity) or the calculated output capacity (e.g., output charge or energy capacity). Alternatively, in some embodiments, the MCU calculates the actual capacity based upon a "full cycle" of the power bank battery (i.e., full charging followed by full draining of the power bank battery, or vice versa). In these embodiments, upon detection of the full charging and full draining, the MCU may average the calculated input capacity and calculated output capacity to determine the actual capacity of the power bank battery. For example, following the 10000 mAh power bank example herein, the 7400 mAh input charge capacity and 7000 mAh output charge capacity are averaged to determine a 7200 mAh actual charge capacity of the power bank battery.

The power bank MCU calculates the health value of the power bank battery based upon the determined actual capacity and the nominal capacity of the power bank battery (e.g., as a ratio or percentage). For example, in a power bank having an actual capacity of 7200 mAh compared to 10000 mAh nominal capacity, the health value of the power bank is represented as 0.72 or 72%.

The health value of the power bank generally decreases over time. Thus, in various embodiments, the power bank may apply the techniques described herein intermittently or continuously to monitor health of the power bank battery. For example, the MCU may continuously monitor charging and draining of the power bank battery and calculate an actual capacity any time the power bank battery is fully charged from 0% to 100% or fully drained from 100% to 0%.

In some embodiments, the MCU may measure the actual capacity when the power bank battery is partially charged (e.g., from 0% to 48% fuel gauge, from 15% to 67%, from 38% to 100%, etc.) or when the power bank battery is partially drained (e.g., from 100% to 63% fuel gauge, from 48% to 17%, from 61% to 0%, etc.). In these embodiments, the monitored inflowing or outflowing charge or energy during the partial charging or partial draining is extrapolated to determine the amount of inflowing or outflowing charge or energy that would occur from a full charging or full draining. For example, if the power bank battery drains 3500 mAh to drain from 67% to 17% fuel gauge (i.e., draining 50%), the MCU doubles the measured drain of 3500 mAh to estimate that the power bank battery would drain 7000 mAh to fully drain, thereby providing an estimation of actual capacity. As another example, if the power bank battery charges 1600 mAh to charge from 0% to 20% fuel gauge, the MCU extrapolates the measured 1600 mAh charge to estimate that the power bank battery would charge 8000 mAh to fully charge. Extrapolated calculations of actual capacity may be less reliable, and thus, the MCU preferably calculates the actual capacity based upon full charging from substantially 0% to substantially 100% fuel gauge, and/or full draining from substantially 100% to substantially 0%.

When the determined health value is equal to or below a threshold value (e.g., 70%, 60%, 50%, 40%, etc.), the power bank automatically transmits an indication of the health value to a mobile computing device of a user. In some embodiments, the threshold value is a predetermined value stored by memory of the power bank MCU (e.g., as set at the time of manufacture of the power bank). Alternatively, in some embodiments, the threshold value is a value set by a user of a mobile computing device via instructions (e.g., a dedicated software application) executing at the mobile computing device. In these embodiments, the mobile computing device transmits an indication of the user-set threshold value to the power bank, i.e., the user assigns the threshold value. The power bank receives the indication and stores the user-set threshold value at the power bank memory.

Still other techniques for determining actual capacity and state of health may be possible, in alternate embodiments. In some embodiments, for example, the power bank uses an impedance check to determine internal resistance of the power bank battery, which is also indicative of state of health. Particularly, the power bank applies one or more short, constant-current pulses (e.g., 2A) internally to the power bank battery. The power bank and measures voltage drop in the battery (e.g., 30 mV, 60 mV, 200 mV, etc.) upon the application of the pulse(s). The voltage drop is caused by the internal resistance in the power bank battery. Because the internal resistance increases over the lifetime of the power bank, voltage drop caused by the constant-current pulse(s) increases proportionally. The power bank may measure the resistance voltage drop and compare the resistance or voltage drop to a threshold value (e.g., 200 mΩ or 400 mV). When the determined voltage drop or resistance value equals to or exceeds the threshold value, the power bank transmits an indication thereof to the mobile computing device.

Example Flow Diagram

Figure 5:
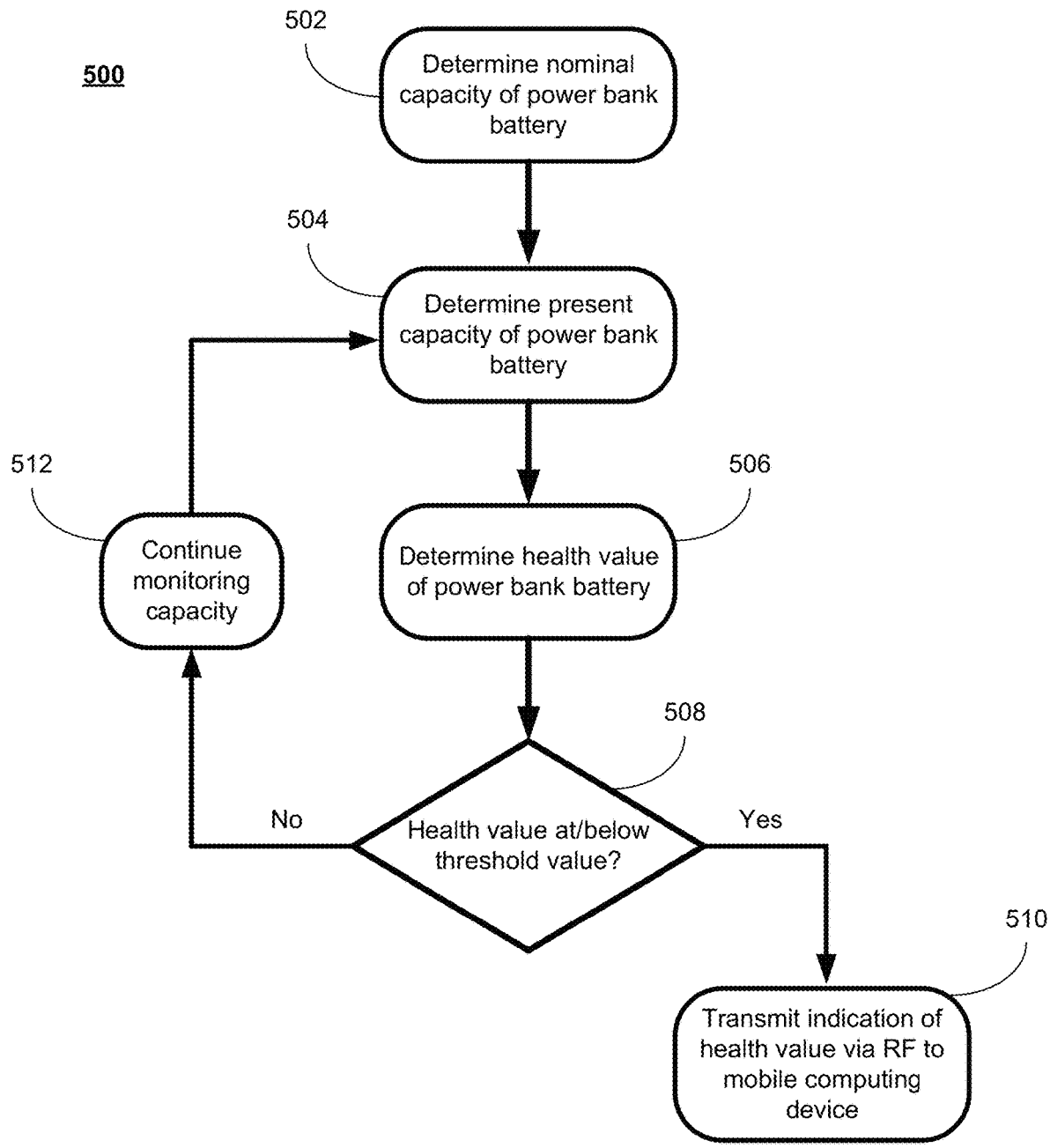
FIG. 5 illustrates an example flow diagram, in accordance with one aspect of the present disclosure.

FIG. 5 depicts a flow diagram 500 associated with monitoring state of health of a battery of a power bank (e.g., of the power bank 140 as depicted in FIG. 1). As described herein, actions represented in the flow diagram 500 may be performed, for example, by the microcontroller (MCU) of the power bank. Actions represented in the flow diagram may include wired and/or wireless communications between the power bank and a mobile computing device external to the power bank (e.g., a smartphone, tablet, etc.).

The MCU determines a nominal capacity of the power bank battery (502). The nominal capacity may be a nominal charge capacity or a nominal energy capacity of the power bank battery. Preferably, the MCU determines the nominal capacity by retrieving the value indicative of the nominal capacity from memory of the MCU (or, retrieves a value indicative thereof, e.g., configuration information of one or more cells of the power bank battery). Alternatively, the MCU determines the nominal capacity by receiving an indication of the nominal capacity of the power bank battery via wired and/or wireless communications (e.g., from a dedicated software application having a stored memory running on the mobile computing device; the stored memory may have a look-up table listing the nominal capacity of various power bank models).

Additionally, the MCU determines an actual capacity of the power bank battery (504). The actual capacity may be an actual charge capacity or an actual energy capacity (in accordance with the unit of measurement of the nominal capacity). Particularly, the MCU may determine the actual capacity by applying the coulomb counting techniques (or energy counting techniques, in the case of a power bank battery having a capacity measured in units of energy) as described in the foregoing (e.g., based upon input capacity and/or output capacity). Alternatively, in some embodiments, the MCU determines the actual capacity of the power bank battery via one or more impedance checks as described herein.

The MCU compares the actual capacity of the power bank battery to the nominal capacity of the power bank battery to determine a health value of the power bank battery based upon the nominal capacity and the actual capacity (506). Particularly, in some embodiments, the health value corresponds to the actual capacity divided by the nominal capacity (e.g., represented as a ratio or percentage).

The MCU determines whether the health value of the power bank is at or below a predetermined threshold value (508). In some embodiments, the predetermined threshold value is stored by the power bank memory (e.g., set at the time of manufacturer, for example at 80%, 70%, 50%, etc.). Alternatively, in some embodiments, the power bank receives an indication of a user-configured threshold value. The user-configured threshold value is set by a user of a mobile computing device, for example via a software application associated with the power bank battery. In these embodiments, the power bank battery receives the user-configured threshold value from the mobile computing devices via wired and/or wireless communications.

If the determined health value is at or below the threshold value, the power bank transmits an indication of the health value to a mobile computing device of a user of the power bank (510). The power bank transmits the indication via wired and/or wireless communications via the communication module of the power bank. The transmitted indication of the health value causes the mobile computing device to display the indication of the state of health of the power bank battery (e.g., a push notification, and/or an image displayed on a screen of a mobile computing device application conveying the state of health information of the power bank).

In some embodiments, the indication of the power of the power bank includes the exact health value. Additionally or alternatively, the indication of the power bank may simply indicate whether or not the user should replace the power bank (e.g., based upon whether the health value is above, equal to, or below the threshold value).

If the determined health value is above the threshold value, transmitting the indication of the health value may not occur. Alternatively, in some embodiments, the power bank transmits the health value any time the health value is determined, thereby allowing the mobile computing device user to monitor the status of their power bank. In any case, the power bank MCU continues to monitor the capacity of the power bank battery (512). For example, the MCU may continuously monitor inflowing and/or outflowing current at the power bank, and may determine present capacity each time the MCU determines that a full charging or full draining of the power bank battery has occurred. Thus, the action(s) 504 are repeated, allowing for detection of whether the power bank battery health value has since fallen to the threshold value or below the threshold value.

Order of actions of the flow diagram 500 may vary. For example, the MCU may determine the actual capacity of the power bank battery before obtaining the nominal capacity of the power bank battery.

Example Graphical User Interface

Figure 6:
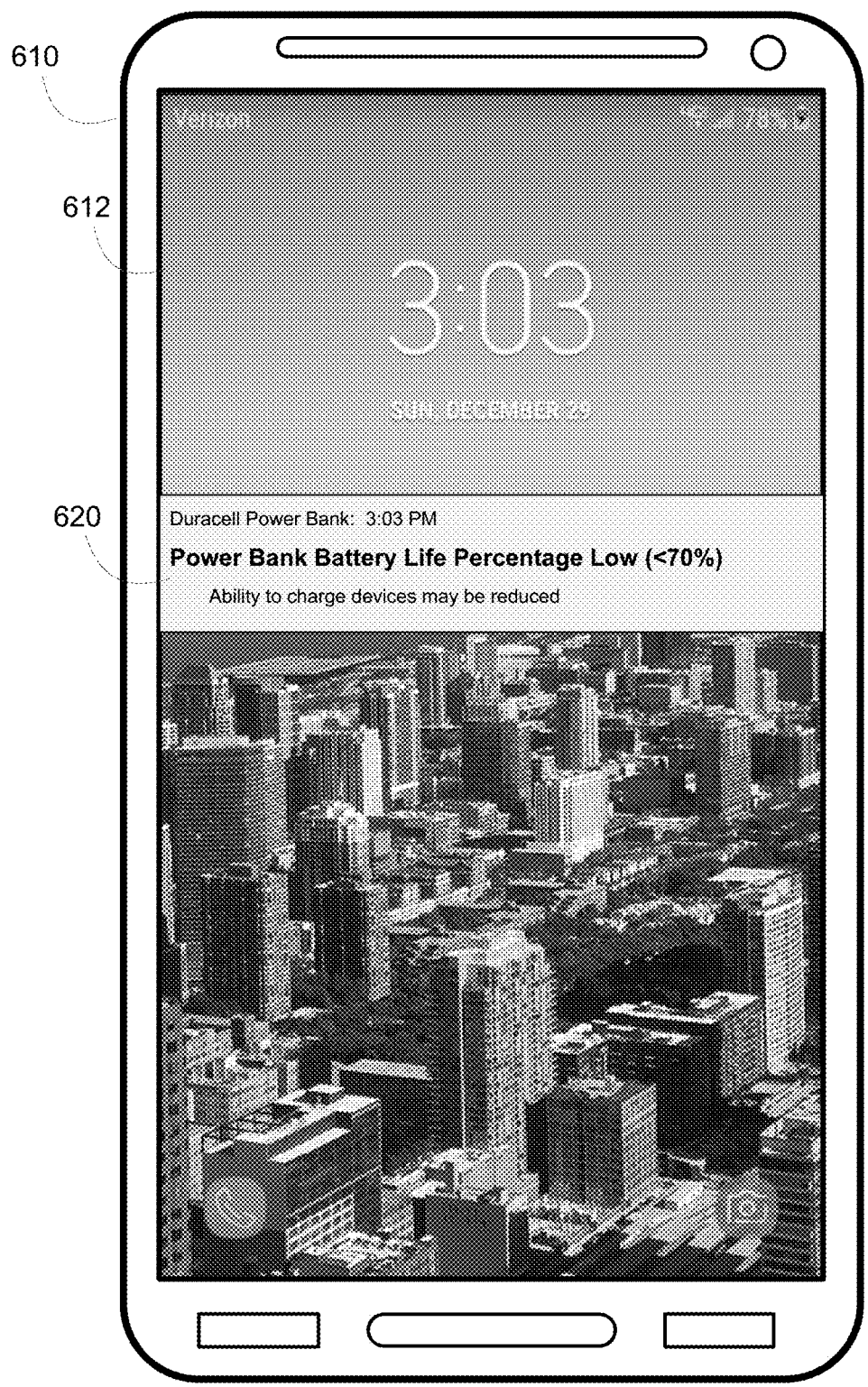
FIG. 6 illustrates an example mobile computing device notification, in accordance with one aspect of the present disclosure.

FIG. 6 illustrates an example notification that may be displayed at a mobile computing device 610 based upon state of health of a power bank associated with the mobile computing device (e.g., owned by a same user). More particularly, FIG. 6 illustrates a screen 612 of the mobile computing device 610, the screen 612 displaying a graphical user interface 620 indicating state of health of the power bank. The mobile computing device 610 may, for example, be any mobile computing device 120 described with respect to FIG. 1 or 2. In some embodiments, the graphical user interface 620 of FIG. 6 is displayed via a dedicated power bank application executing at the mobile computing device 610 (e.g., power bank application 156 of FIG. 1).

The graphical user interface 620 displays an indication of the state of health (referred to as "life percentage" in FIG. 6) of the power bank. Particularly, the graphical user interface 620 indicates that the present capacity the power bank is less than 70% of the nominal capacity of the power bank, and advises the user of the mobile computing device 610 that ability of the power bank to charge devices may be reduced.

Different health value thresholds may be envisioned, in various embodiments. Furthermore, additional or alternative graphical user interfaces are possible, in various embodiments. For example, the notifications of FIG. 6 may be substituted or supplemented with other screens of a power bank application executing at the mobile computing device 610 (e.g., full-screen displays) Additional or alternative user interfaces may provide similar information to that shown in FIG. 6 and/or may provide other charging-related information described herein. Furthermore, user interface techniques may be implemented that use audio input/output via a microphone and/or speaker of the mobile device 610, in various embodiments, to communicate audio push notifications.

Example Flow Diagram

Figure 7:
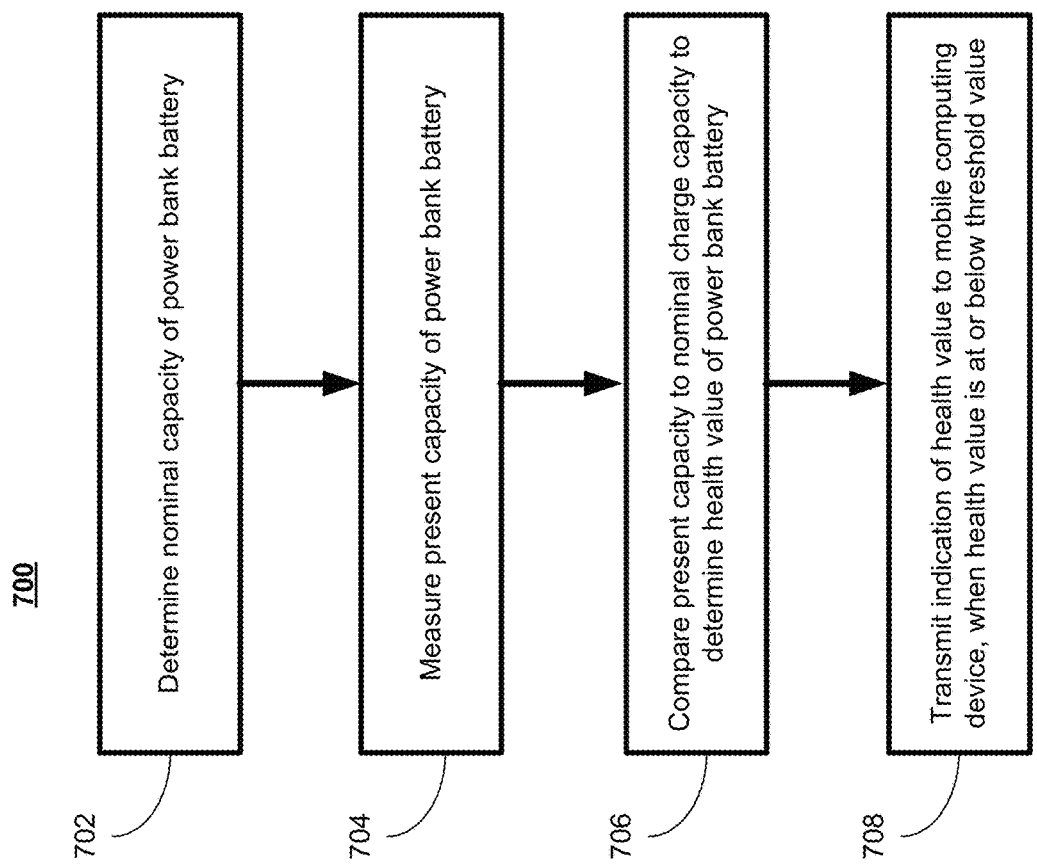
FIG. 7 illustrates an example method associated with a power bank, in accordance with one aspect of the present disclosure.

FIG. 7 depicts a block diagram corresponding to an example method 700 associated with determining state of health of a battery of a power bank (e.g., of the power bank 140 as depicted in FIG. 1). At least some actions of the method 700 may correspond to actions in the flow diagram 500 of FIG. 5.

The method 700 includes determining a nominal capacity (e.g., nominal charge capacity or energy capacity) of the power bank battery (702). Particularly, a microcontroller (MCU) of the power bank determines the nominal capacity by retrieving the nominal capacity from memory at the power bank as explained herein with reference to FIG. 5. The method 700 further includes determining an actual capacity of the power bank (704, e.g., via coulomb counting, energy counting, or impedance check as described herein). Additionally, the method 700 includes comparing the actual capacity of the power bank to the nominal capacity of the power bank to determine a health value of the power bank (706). The method 700 includes transmitting an indication of the health value to a mobile computing device when the health value is at or below a threshold value (708).

The method 700 may include additional, fewer, or alternate actions, in various embodiments.

Additional Considerations

All of the foregoing computer systems may include additional, less, or alternate functionality, including that discussed herein. All of the computer-implemented methods may include additional, less, or alternate actions, including those discussed herein, and may be implemented via one or more local or remote processors and/or transceivers, and/or via computer-executable instructions stored on computer-readable media or medium.

The processors, transceivers, mobile devices, and/or other computing devices discussed herein may communicate with each via wireless communication networks or electronic communication networks. For instance, the communication between computing devices may be wireless communication or data transmission over one or more radio links, or wireless or digital communication channels.

The following additional considerations apply to the foregoing discussion. Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Additionally, certain embodiments are described herein as including logic or a number of routines, subroutines, applications, or instructions. These may constitute either software (e.g., code embodied on a machine-readable medium or in a transmission signal) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules may provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and may operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description, and the claims that follow, should be read to include one or at least one and the singular also includes the plural unless it is obvious that it is meant otherwise.

The patent claims at the end of this patent application are not intended to be construed under 35 U.S.C. § 112(f) unless traditional means-plus-function language is expressly recited, such as "means for" or "step for" language being explicitly recited in the claim(s).

The systems and methods described herein are directed to improvements to computer functionality, and improve the functioning of conventional computers.

This detailed description is to be construed as exemplary only and does not describe every possible embodiment, as describing every possible embodiment would be impractical, if not impossible. One may be implement numerous alternate embodiments, using either current technology or technology developed after the filing date of this application.

What is claimed is:

1. A portable power bank device, comprising:
   a rechargeable battery for supplying electric charge to a mobile computing device external to the power bank via an electrical connection between the power bank battery and a battery of the mobile computing device, the power bank battery having a nominal capacity;
   a communication module for exchanging communication signals with the mobile computing device; and
   a control module comprising one or more processors and a memory storing non-transitory computer executable instructions that, when executed via the one or more processors, cause the power bank to:
      receive from the mobile computing device, via the communication module, an indication of a threshold health value associated with the power bank battery, store the threshold health value at the power bank memory,
determine the nominal capacity of the power bank battery,
measure a present capacity of the power bank battery, the present capacity being an actual amount of electrical charge or energy that the power bank battery is capable of holding at a time at which the present capacity is measured,
compare the present capacity of the power bank battery to the nominal capacity of the power bank battery to determine a present health value of the power bank battery,
compare the present health value to the threshold health value stored at the power bank memory, and
transmit to the mobile computing device, via the communication module, an indication of the present health value of the power bank battery when the present health value is less than or equal to the stored threshold health value.

2. The portable power bank device, of claim 1, wherein the instructions to measure the present capacity include non-transitory computer executable instructions that, when executed via the one or more processors, cause the power bank to:
monitor an inflowing electric current to the power bank battery during a time interval corresponding to a charging of the power bank battery; and
calculate an input charge capacity of the power bank battery based upon the monitored inflowing electric current over the time interval; and
determine the present capacity based upon the calculated input charge capacity.

3. The portable power bank device, of claim 1, wherein the instructions to measure the present capacity include non-transitory computer executable instructions that, when executed via the one or more processors, cause the power bank to:
monitor an outflowing electric current from the power bank battery during a time interval corresponding to a supply of electric charge from the power bank battery to the mobile computing device;
calculate an output charge capacity of the power bank battery based upon the monitored outflowing electric current over the time interval; and
determine the present capacity based upon the calculated output charge capacity.

4. The portable power bank device, of claim 1, wherein the instructions to measure the present capacity include non-transitory computer executable instructions that, when executed via the one or more processors, cause the power bank to:
monitor an inflowing electric current to the power bank battery and a voltage of the power bank battery during a time interval corresponding to a charging of the power bank battery;
calculate an input energy capacity of the power bank battery based upon the monitored inflowing electric current and the voltage over the time interval; and
determine the present capacity based upon the calculated input energy capacity.

5. The portable power bank device, of claim 1, wherein the instructions to measure the present capacity include non-transitory computer executable instructions that, when executed via the one or more processors, cause the power bank to:
monitor an outflowing electric current from the power bank battery and a voltage of the power bank battery during a time interval corresponding to a supply of electric charge from the power bank battery to the mobile computing device;
calculate an output energy capacity of the power bank battery based upon the monitored outflowing electric current and the voltage over the time interval; and
determine the present capacity based upon the calculated output energy capacity.

6. The portable power bank device of claim 1, wherein the instructions to transmit the indication of the present health value include instructions to transmit the present health value to the mobile computing device via wireless radio frequency (RF) communications.

7. The portable power bank device of claim 1, wherein the electrical connection between the power bank battery and the mobile computing device battery comprises a wireless electrical connection between the power bank and the mobile computing device.

8. The portable power bank device of claim 1, wherein the electrical connection between the power bank battery and the mobile computing device battery comprises a wired electrical connection between the power bank and the mobile computing device.

9. The portable power bank device of claim 1, wherein the threshold value is a value defined by a user of the mobile computing device via an application executing at the mobile computing device.

10. A method comprising:
receiving, via a communication module of a portable power bank, from a mobile computing device external to the power bank, an indication of a threshold health value associated with a rechargeable battery of the power bank, the power bank battery being configured to supply electric charge to the mobile computing device via an electrical connection between the power bank battery and a battery of the mobile computing device;
storing the threshold health value at a memory of the power bank;
determining, by a processor of the power bank, a nominal capacity of the rechargeable battery of the power bank;
obtaining, by the processor of the power bank, a measurement of a present capacity of the power bank battery, the present capacity being an actual amount of electrical charge or energy that the power bank battery is capable of holding at a time at which the present capacity is measured;
comparing, by the processor of the power bank, the present capacity to the nominal capacity to determine a present health value of the power bank battery;
comparing, by the processor of the power bank, the present health value to the threshold health value stored at the power bank memory; and
transmitting, via the communication module of the power bank, to the mobile computing device external to the power bank, an indication of the present health value of the power bank battery when the present health value is less than or equal to the stored threshold health value.

11. The method of claim 10, wherein measuring the present capacity of the power bank battery comprises:
monitoring, via the processor of the power bank, an inflowing electric current to the power bank battery during a time interval corresponding to a charging of the power bank battery;

calculating, via the processor of the power bank, an input charge capacity of the power bank battery based upon the monitored inflowing electric current over the time interval; and determining, via the processor of the power bank, the present capacity based upon the calculated input charge capacity.

12. The method of claim 10, wherein measuring the present capacity of the power bank battery comprises:

monitoring, via the processor of the power bank, an outflowing electric current from the power bank battery during a time interval corresponding to a supply of electric charge from the power bank battery to the mobile computing device;

calculating, via the processor of the power bank, an output charge capacity of the power bank battery based upon the monitored outflowing electric current over the time interval; and determining, via the processor of the power bank, the present capacity based upon the calculated output charge capacity.

13. The method of claim 10, wherein measuring the present capacity of the power bank battery comprises:

monitoring, via the processor of the power bank, an inflowing electric current to the power bank battery and a voltage of the power bank battery during a time interval corresponding to a charging of the power bank battery;

calculating, via the processor of the power bank, an input energy capacity of the power bank battery based upon the monitored inflowing electric current and the voltage over the time interval; and determining, via the processor of the power bank, the present capacity based upon the calculated input energy capacity.

14. The method of claim 10, wherein measuring the present capacity of the power bank battery comprises:

monitoring, via the processor of the power bank, an outflowing electric current from the power bank battery and a voltage of the power bank battery during a time interval corresponding to a supply of electric charge from the power bank battery to the mobile computing device;

calculating, via the processor of the power bank, an output energy capacity of the power bank battery based upon the monitored outflowing electric current and the voltage over the time interval; and determining, via the processor of the power bank, the present capacity based upon the calculated output energy capacity.

15. The method of claim 10, wherein transmitting the indication of the present health value includes transmitting the indication of the present health value to the mobile computing device via wireless radio frequency (RF) communications.

16. The method of claim 10, wherein the electrical connection between the power bank battery and the mobile computing device battery comprises a wireless electrical connection between the power bank and the mobile computing device.

17. The method of claim 10, wherein the electrical connection between the power bank battery and the mobile computing device battery comprises a wired electrical connection between the power bank and the mobile computing device.

18. The method of claim 10, wherein the threshold value is a value defined by a user of the mobile computing device via an application executing at the mobile computing device.

\* \* \* \* \*